United States Patent
Berchowitz

(10) Patent No.: US 6,549,408 B2
(45) Date of Patent: Apr. 15, 2003

(54) CPU COOLING DEVICE USING THERMO-SIPHON

(75) Inventor: David M. Berchowitz, Athens, OH (US)

(73) Assignee: Global Cooling BV, Zutphen (NL)

(*) Notice: Subject to any disclaimer, the term of this patent is extended or adjusted under 35 U.S.C. 154(b) by 0 days.

(21) Appl. No.: 09/992,751

(22) Filed: Nov. 16, 2001

(65) Prior Publication Data

US 2002/0075652 A1 Jun. 20, 2002

(30) Foreign Application Priority Data

Nov. 20, 2000 (JP) .................................. 2000-353292

(51) Int. Cl.[7] ................................................ H05K 7/20
(52) U.S. Cl. ................... 361/700; 361/699; 361/701; 257/714; 257/715; 174/15.1; 165/80.4
(58) Field of Search ........................ 361/689, 693, 361/699–703; 257/714, 715; 174/15.1, 15.2; 165/80.4, 104.33, 104.21, 104.29

(56) References Cited

U.S. PATENT DOCUMENTS

| | | | | |
|---|---|---|---|---|
| 3,609,991 A | * | 10/1971 | Chu et al. | 62/333 |
| 3,986,550 A | * | 10/1976 | Mitsuoka | 165/104.21 |
| 5,195,577 A | * | 3/1993 | Kameda et al. | 165/104.13 |
| 5,203,399 A | * | 4/1993 | Koizumi | 165/104.33 |
| 5,349,823 A | | 9/1994 | Solomon | |
| 5,818,097 A | * | 10/1998 | Rohlfing et al. | 257/468 |
| 5,859,763 A | * | 1/1999 | Nam et al. | 361/699 |
| 5,925,929 A | * | 7/1999 | Kuwahara et al. | 257/714 |
| 5,940,270 A | * | 8/1999 | Puckett | 361/699 |
| 6,230,788 B1 | * | 5/2001 | Choo et al. | 165/46 |
| 6,234,240 B1 | * | 5/2001 | Cheon | 165/80.3 |
| 6,257,323 B1 | * | 7/2001 | Kuo | 165/104.21 |

FOREIGN PATENT DOCUMENTS

| JP | 359217346 A | * | 12/1984 | ............ | 165/104.33 |

* cited by examiner

*Primary Examiner*—Boris Chervinsky
(74) *Attorney, Agent, or Firm*—Frank H. Foster; Kremblas, Foster, Phillips & Pollick

(57) ABSTRACT

A hollow evaporator is disposed in contact with the upper surface of the CPU. Heat from the CPU is absorbed by the evaporation of the refrigerant. The vaporized refrigerant ascends through the vapor flow channel by convection, flows into a condenser located above the evaporator, and radiates heat to be liquefied. The liquefied refrigerant flows down by its own weight through the liquid flow channel and returns to the evaporator. This circulation is repeated in this manner.

2 Claims, 3 Drawing Sheets

CPU COOLING DEVICE USING THERMO-SIPHON

BACKGROUND OF THE INVENTION

The present invention relates to a CPU cooling device using a thermo-siphon for cooling, in particular a central processing unit (hereinafter referred to as a "CPU") used in a desktop type computer.

Today, computers are becoming smaller and to be operated at higher speed than ever. Electronic circuits of the CPU are more integrated and produce more heat. Accordingly, methods to improve cooling capacity of the CPU have been desirable.

Conventionally, CPU is cooled by drawing ambient air into the computer cabinet by using fans and ventilation systems and circulating the air over the CPU. Amount of heat per unit area produced from CPU becomes larger, it requires either to increase air flow circulating over the CPU or to dispose cooling fins in order to increase heat-transmission areas. However, increase of air flow causes a larger consumption of electric power and more noise by the fans, and an increase of spaces for air flow passages around the CPU. Further, disposing cooling fins requires additional spaces and prevents size reduction of the computers. To blow pre-cooled air against the CPU is also available. However, as it needs devices for pre-cooling air, it increases both manufacturing and operating cost of the computer as well as their size.

BRIEF SUMMARY OF THE INVENTION

Briefly, an object of the present invention is to provide an improved cooling device using a thermo-siphon for cooling CPU. The cooling device saves operating cost, consumes less electricity, and reduces operating noises while enhancing cooling capacity of the CPU.

More specifically, first object of the present invention is to provide an improved cooling device using a thermo-siphon which efficiently absorbs heat generated from the CPU from a restricted space. Second object is to provide a cooling device using a thermo-siphon which needs no external power such as a pump or the like for circulating the refrigerant. Third object is to provide a cooling device using a thermo-siphon which efficiently take enough heat out of CPU in such cases that the CPU is planed to run in relatively low temperature, that the CPU produces much heat, and that the space for the condenser is small.

In order to solve these problems, first feature of the present invention comprises an evaporator disposed in contact with the CPU and a condenser located above the evaporator. The evaporator is a hollow vessel having an inlet port of a refrigerant and an outlet port thereof. The condenser has an inflow portion of a vaporized refrigerant located at an upper portion thereof and an outflow portion of a liquefied refrigerant located at a lower portion thereof. The inlet port of the refrigerant and the outflow portion of the liquefied refrigerant are connected by a liquid flow channel, while the outlet port of the refrigerant and the inflow portion of the vaporized refrigerant are connected by a vapor flow channel. A predetermined amount of refrigerant fills a flow circulating channel comprising the evaporator, the condenser, the liquid flow channel, and the vapor flow channel. The refrigerant absorbs heat from the CPU in the evaporator to be evaporated, ascends through the vapor flow channel, enters into the condenser, radiates the heat in the condenser to be liquefied, flows down through the liquid flow channel, and returns to the evaporator.

The condenser refers to all means having a structure with an inflow portion located at its upper portion into which the vaporized refrigerant flows, and an outflow portion located at its lower portion from which the liquefied refrigerant flows out, and the vaporized refrigerant radiates heat to the outside in the portion of the flow channel between the inflow portion and the outflow portion. The refrigerant includes all refrigerants which operates in the states of liquid and gas in the flow channel and has the property of evaporating (being gasified) from liquid to vapor at temperatures lower than allowable temperatures of the CPU.

By configuring the invention in this manner, heat from the CPU is absorbed into the liquefied refrigerant having a higher heat transmission rate than air, and the absorbed heat is converted into the evaporated heat of the refrigerant. The vaporized refrigerant ascends through the vapor flow channel, flows into the condenser from the inflow portion of the vaporized refrigerant, and radiates heat in the condenser to be liquefied. The liquefied refrigerant moves by its own weight toward the outflow portion of the liquefied refrigerant, while gradually increasing the flow rate in the condenser. Then the liquefied refrigerant flows down through the liquid flow channel from the outflow portion and returns to the evaporator.

Accordingly, heat from the CPU can be efficiently absorbed from the small surface of the CPU without cooling fins and the like. Further, as the condenser may be positioned away from the CPU, spaces for the flow passage of the cooled air or the like is not required around the CPU. Therefore, wiring of parts associated with CPU can be more integrated and the structure of the periphery of the CPU can be decreased. Furthermore, as the refrigerant can be circulating continuously through the flow channel without external power such as a pump or the like, energy conservation and noise reduction can be achieved.

The present invention employs a configuration of a thermo-siphon in which the evaporator and the condenser is connected by two flow channels; a vapor flow channel and a liquid flow channel. It enables to improve the heat absorption effect at the evaporator and the heat radiation effect at the condenser.

Another configuration is possible, in which an evaporator and a condenser are connected by a thick single flow channel. In the latter configuration, a vaporized refrigerant ascends through the flow channel by convection and radiates heat in a condenser, while a liquefied refrigerant flows down by its own weight through the same flow channel and returns to the evaporator located at the lower position. As the ascending vaporized refrigerant comes into contact with the descending liquefied refrigerant in the single flow channel, there happens heat exchanges between the liquefied refrigerant and the vaporized refrigerant inside the flow channel. Consequently, as the temperature of the liquefied refrigerant rises, both the absorbed heat from the CPU and the radiated heat at the condenser are decreased. In contrast, in the configuration employed in the present invention where the flow channel is divided into a vapor flow channel and a liquid flow channel, all the vaporized refrigerant can be used to radiate heat in the condenser, while all the liquefied refrigerant can be used to lower the temperature of the CPU in the evaporator, thereby improving the effect of absorbing heat from the CPU.

A second feature of the present invention is to provide the CPU cooling device according to the first feature, wherein said condenser comprises a flow channel and a heat-radiating fin. The flow channel has the inflow portion of the vaporized refrigerant located at the upper portion of the condenser and the outflow portion of the liquefied refrigerant located at the lower portion thereof. The heat-radiating fin is disposed in contact with the flow channel. The flow channel can be configured in being straight, being folded back a plurality of times on the same level, or being spirally wound a plurality of times. By configuring the present invention in this manner, a CPU cooling device with small and low cost condenser can be realized.

Third feature of the present invention is to provide the CPU cooling device according to the first or second feature, wherein the flow area of the liquid flow channel is smaller than that of said vapor flow channel. By configuring the present invention in this manner, reverse flows of the vaporized refrigerant through the liquid flow channel can be prevented. Consequently, circulation of the refrigerant improves to increase the amount of heat absorbed from the CPU.

Fourth feature of the present invention is to provide the CPU cooling device according to any one of the first to third features, wherein the liquid flow channel is disposed inside of the vapor flow channel. As this configuration saves spaces for disposing the flow channel, arrangement of the flow channel is more facilitated.

Fifth feature of the present invention is to provide the CPU cooling device according to the first to fourth features, wherein the refrigerant is pre-pressurized and sealed. By configuring the invention in this manner, the vaporized refrigerant having the same mass circulate in narrower flow channel area. As spaces for arranging the flow channel is decreased, arrangements of the flow channel are more facilitated. Further, the evaporating temperature of the refrigerant can be altered by changing the operating pressure of the refrigerant to cope with allowable temperatures of the CPU.

Sixth feature of the present invention is to provide the CPU cooling device according to the first to fifth features, wherein the condenser comprises a flow channel and a Stirling refrigerator. The flow channel has the inflow portion of the vaporized refrigerant located at an upper portion of the condenser and the outflow portion of the liquefied refrigerant located at a lower portion thereof. The flow channel is disposed in contact with a heat sink portion of the Stirling refrigerator. The Stirling refrigerator can be light and small-sized while efficiently working in low electric power.

The Stirling refrigerator means a known-art device in which an external combustion engine is modified to a refrigerating device to provide a heat sink function by giving an external power. By configuring the invention in this manner, it is possible to efficiently cool the CPU, even though it generates larger amount of heat. In general, amount of heat from the CPU is greater, more heat transmission area of the condenser for radiating heat of the vapor is required. However, there are found situations where small spaces are available for a heat transmission area. In such situations, the Stirling refrigerator can provide enough heat radiating capacity.

BRIEF DESCRIPTION OF THE SEVERAL VIEWS OF THE DRAWINGS

The present invention together with the above and other objects and advantages may best be understood from the following detailed description and upon reference to the drawings, wherein.

Figure 1:
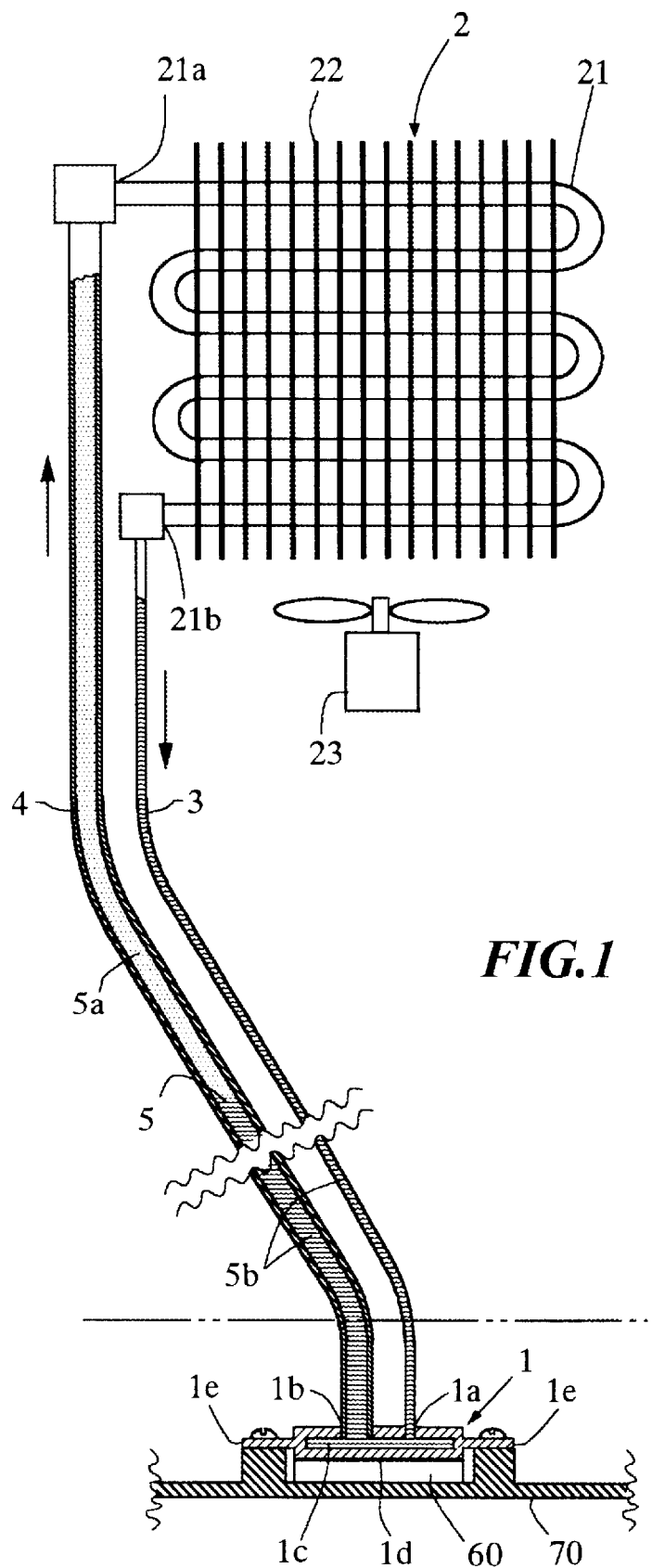
FIG. 1 is a schematic structural view of a CPU cooling device using a thermo-siphon.

While the invention is susceptible to various modifications and alternative forms, a specific embodiment thereof has been shown by way of example in the drawings and will herein be described in detail. It should be understood, however, that it is not intended to limit the invention to the particular forms disclosed, but to the contrary, the intention is to cover all modifications, equivalents, and alternatives falling within the spirit and scope of the invention as defined by the appended claims.

DETAILED DESCRIPTION OF THE INVENTION

Present invention is shown in three embodiments. The first embodiment, shown in FIG. 1, corresponds to the third feature of the present invention. The second embodiment, shown in FIG. 2, corresponds to the fourth feature thereof. The third embodiment, shown in FIG. 3, corresponds to the sixth feature thereof.

Referring to FIG. 1, a CPU cooling device using a thermo-siphon comprises an evaporator 1 disposed in contact with a CPU 60 and a condenser 2 located above the evaporator 1. The evaporator 1 is a vessel having a hollow portion 1c inside. A refrigerant inlet port 1a and a refrigerant outlet port 1b are disposed on the upper surface of the evaporator 1. The evaporator 1 is formed of sheet metals of aluminum alloy or copper alloy, either of which having the property of transmitting heat in a higher rate. The evaporator 1 is disposed such that its bottom surface 1d closely contacts approximately the entire surface of the upper surface of the CPU 60. Then, the evaporator 1 has horizontal flanges 1e at both sides thereof, and both flanges are screwed to the base 70.

The condenser 2 comprises a horizontal pipe 21 which is folded back in a U-shaped configuration a plurality of times and a vertical fin 22 comprising a plurality of thin plates which are disposed in parallel and soldered to the horizontal pipe 21. The left end of the upper portion of the horizontal pipe 21 is the inflow portion 21a of the vaporized refrigerant 5a, while the left end of the lower portion of thereof is the outflow portion 21b of the liquefied refrigerant 5b. The horizontal pipe 21 and the vertical fin 22 are formed of aluminum alloy or copper alloy, either of which has a large heat transmission rate. An electric fan 23 is provided below the vertical fin 22 so that outside air is drawn into and blown to the vertical fin 22 to improve heat radiation effect.

The refrigerant inlet port 1a of the evaporator 1 and the outflow portion 21b of the liquefied refrigerant 5b are connected by a liquid flow channel 3 comprising a thin pipe. The outlet port 1b of the evaporator 1 and the inflow portion 21a of the vaporized refrigerant 5a are connected by a vapor flow channel 4 comprising a pipe. Both the liquid flow channel 3 and the vapor flow channel 4 are formed of aluminum alloy or copper alloy. The diameter of the vapor flow channel 4 is larger than that of the liquid flow channel 3.

The flow circulating channel comprising the evaporator 1, the condenser 2, the liquid flow channel 3, and the vapor flow channel 4, is filled with pure water as the refrigerant 5. Amount of the refrigerant 5 in the flow circulating channel is determined so that even under extreme operating conditions in which temperature of the refrigerant 5 becomes maximum, the liquefied refrigerant 5b remains in the hollow portion 1c of the evaporator 1.

Referring again to FIG. 1, one cycle of operation of the first embodiment will be examined. Heat from the CPU 60 is transmitted to the liquefied refrigerant 5b in the hollow portion 1c via a lower surface of the evaporator 1. The hot liquefied refrigerant 5b ascends through the vapor flow channel 4 by convection. When temperature of the liquefied refrigerant 5b reaches its evaporation point, the liquefied refrigerant 5b evaporates to become the vaporized refrigerant 5a. Accordingly, the evaporation heat of the refrigerant 5 prevents rising of the temperature of the liquefied refrigerant 5b and overheating of the CPU60.

Most of the hot and light vaporized refrigerant 5a ascends through the vapor flow channel 4 and enters into the horizontal pipe 21 from the inflow portion 21a. When the vaporized refrigerant 5a passes through the horizontal pipe 21, heat of the vaporized refrigerant 5a is removed through the horizontal pipe 21, and the vaporized refrigerant is liquefied. The heat absorbed from the vaporized refrigerant 5a is radiated into the air circulating around the surface of the vertical fin 22 by a fan 23.

Then, the liquefied refrigerant 5b moves down by its own weight through the horizontal pipe 21, gradually increase its amount, enters into the liquid flow channel 3 from the outflow portion 21b, and returns to the evaporator 1. As the vaporized refrigerant 5a decreases its volume by the heat radiation and the liquidation in the condenser 2, the refrigerant 5, which is continuously vaporized in the vapor flow channel 4, enters into the condenser 2.

Temperature of the liquefied refrigerant 5b in the liquid flow channel 3 is lowered by the colder liquefied refrigerant 5b which is continuously flowing down through the liquid flow channel 3. Consequently, evaporation of the liquefied refrigerant 5b at the surface thereof is prevented. The cold liquefied refrigerant 5b in the liquid flow channel 3 returns to the evaporator 1 by convection. The liquefied refrigerant 5b absorbs heat from the CPU 60 again, increases its temperature, and ascends through the vapor flow channel 4 by convection.

In this manner, while circulating through the evaporator 1, the vapor flow channel 4, the horizontal pipe 21, and the liquid flow channel 3 in this order, the refrigerant 5 absorbs heat from the CPU 60 in the evaporator 1, radiates the heat at the condenser 2, and is liquefied. That is, the present invention works as a cooling device using a so-called thermo-siphon to cool the CPU 60.

Figure 2:
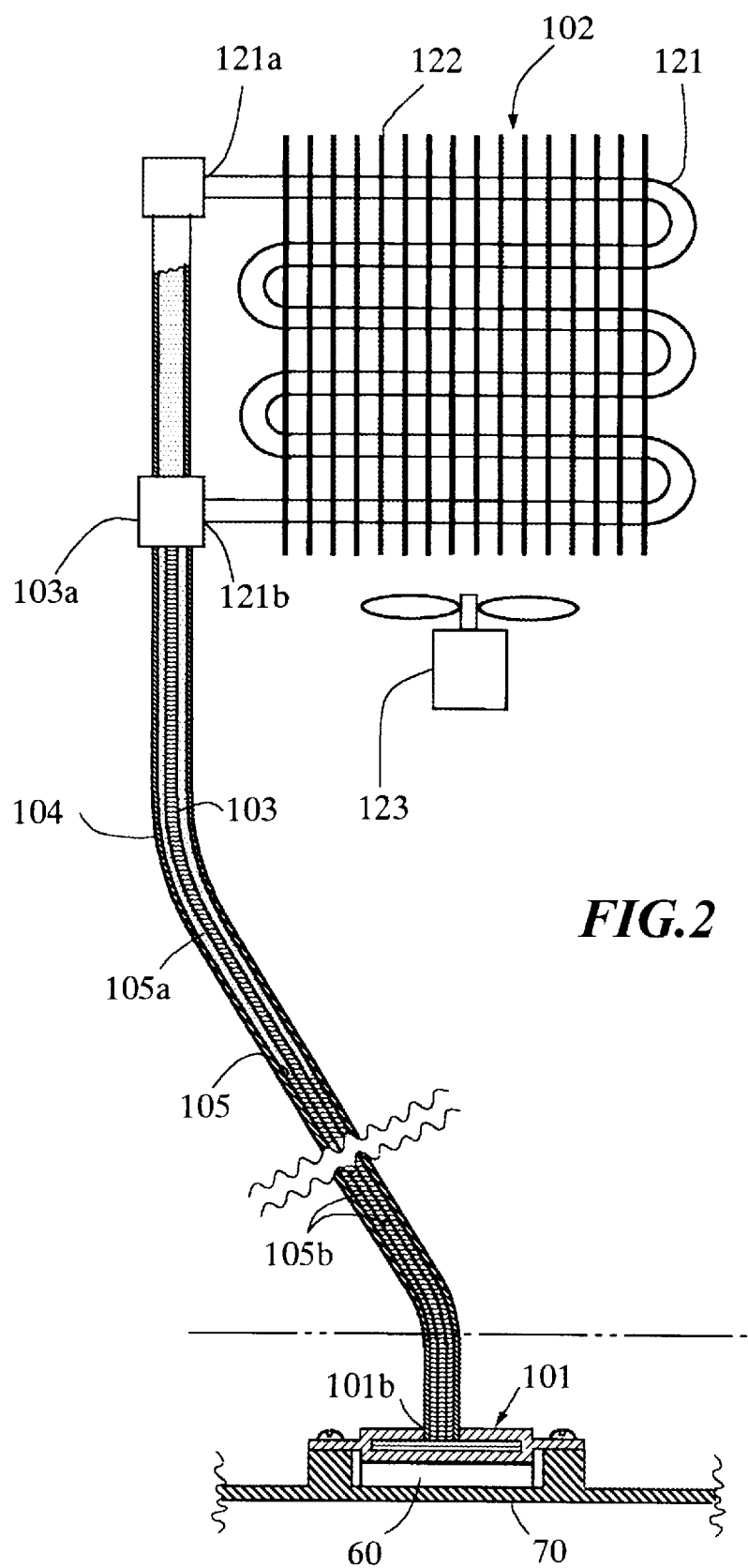
FIG. 2 is a schematic structural view showing the CPU cooling device using the thermo-siphon in an embodiment where a liquid flow channel is disposed inside a vapor flow channel.

Referring next to FIG. 2, a liquid flow channel 103 has a smaller diameter than that of a vapor flow channel 104. The liquid flow channel 103 is disposed inside the vapor flow channel 104. The upper end of the liquid flow channel 103 is introduced to the outside of the vapor flow channel 104 via an elbow 103a and is connected to an outflow portion 121b of the horizontal pipe 121. The lower end of the vapor flow channel 104 is connected to a refrigerant outlet port 101b disposed on the upper surface of the evaporator 1. The lower opening of the liquid flow channel 103 is disposed at the near-center of the lower end of the vapor flow channel 104. The vaporized refrigerant 105a ascends through the passage between the inside of the vapor flow channel 104 and the outside of the liquid flow channel 103. The liquefied refrigerant 105b liquefied in the horizontal pipe 121 descends through the liquid flow channel 103.

Figure 3:
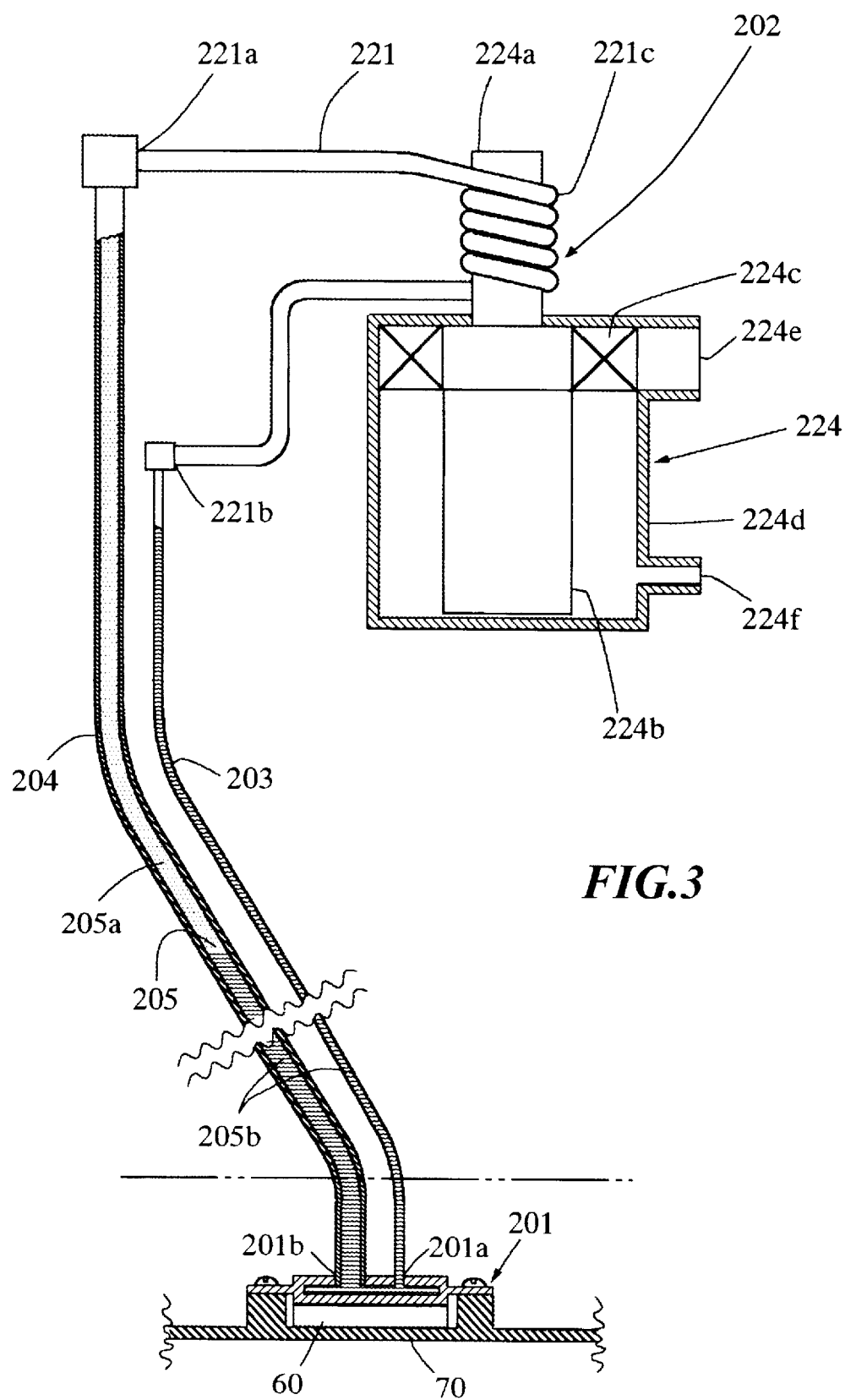
FIG. 3 is a schematic structural view showing a CPU cooling device using the thermo-siphon in an embodiment where a Stirling refrigerator is used as a condenser.

Referring then to FIG. 3, a condenser 202 comprises a flow channel 221 and a Stirling cooler 224. An inflow portion 221a is disposed at the upper end of the flow channel 221 and an outflow portion 221b is disposed at the lower end of the flow channel 221. The intermediate portion of the flow channel 221 is a wound portion 221c, which is twisted and wound a plurality of times closely around the heat sink portion 224a of the Stirling cooler 224. Liquefied carbon dioxide is used as the refrigerant in this embodiment.

Still referring to FIG. 3, summarizing the circulation of the refrigerant 205, the vaporized refrigerant 205a ascends through the vapor flow channel 204, and enters into the flow channel 221 at the inflow portion 221a. Absorbing heat at the wound portion 221c and radiating the heat to the heat sink portion 224a, the vaporized refrigerant 205a becomes a liquefied refrigerant 205b. The liquefied refrigerant 205b continues to move down by its own weight and enters into the liquid flow channel 203 at the outflow portion 221b.

The Stirling cooler 224 comprises a column-like shaped heat sink portion 224a, a main body portion 224b disposed under the heat sink portion 224a, and a heat radiating portion 224c provided in a ring-like configuration between the heat sink portion 224a and the main body portion 224b. The heat radiating portion 224c and the main body portion 224b are enclosed in a vessel 224d, which has an air outlet hole 224e and an air inlet hole 224f. The main body portion 224b has a piston driven by a linear motor and a displacer, which alternately compresses and expands sealed helium, and absorbs heat from the heat sink portion 224a and radiate the heat from the heat radiating portion 224c. The heat radiated from the heat-radiating portion 224c is discharged into the outside by introducing air from the inlet hole 224f of the vessel 224d by flowing out the air from the outlet hole 224e.

The refrigerants 5, 105 and 205 used in each embodiment of the present invention using thermo-siphon is not limited to water and carbon dioxide. Alternative materials, which evaporates at a temperature lower than the permissible temperature of the CPU 60 which varies depending on the kind of CPU 60, can be used as a refrigerant. Namely, heat of the CPU 60 is absorbed by the evaporation of the refrigerant 5 or the like. On the other hand, the evaporating point of a refrigerant is held at a specified pressure. Therefore, for a CPU 60 normally operating above 100° C., water can be used as a refrigerant. If a CPU 60 normally operates in a relatively low temperature, a refrigerant of a substantially low evaporating point, such as butane or the like, should be used as a refrigerant. Further, by changing the amount of pressure by which the refrigerant is pre-pressurized before filling the circulating flow circuit, the evaporating point of the refrigerant can be altered in order to be adaptable to the permissible temperature of the CPU 60.

Materials for the evaporators 1, 101, 201, liquid flow channels 3, 103, 203, and the vapor flow channels 4, 104, 204 is not restricted to aluminum alloy or copper alloy. Other metals such as stainless steel or the like may alternatively be used for those portions. Further, the configuration of the evaporator 1, 101, 102 is not limited to the embodiment described above. The evaporator may be disposed in contact with the side of CPU 60 or with the fins disposed on the CPU 60.

Alternative configurations may be employed for the horizontal pipes 21, 121 and the wound portion 221c as long as the liquefied refrigerant 5b, 105b, 205b gravitationally moves down from the inflow portion 21a, 121a, 221a at an upper position to the outflow portion 21b, 121b, 221b at a lower position. Alternative configurations for the vertical fin 22, 122, which has predetermined heat radiation area, may be employed. Further, the electric fan 23, 123 may be omitted if enough spaces for the vertical fin 22, 122 having a predetermined heat radiation area are provided.

What is claimed is:

1. A device for cooling a CPU, the device comprising:
   (a) a thermo-siphon comprising
      (i) an evaporator disposed in contact with the CPU, the evaporator being a hollow vessel having a refrigerant inlet port and refrigerant outlet port;
      (ii) a condenser comprising a flow channel located above the evaporator, the condenser having a vaporized refrigerant inflow portion located at an upper portion thereof and a liquefied refrigerant outflow portion located at a lower portion thereof;
      (iii) a vapor flow channel connecting the evaporator refrigerant outlet port to the condenser refrigerant inflow portion; and
      (iv) a liquid flow channel connecting said inlet port of the refrigerant and said outflow portion of the liquefied refrigerant;
   (b) a Stirling refrigerator having a heat sink portion disposed in contact with the condenser flow channel;
   (c) a predetermined amount of pressurized, $CO_2$, refrigerant sealed within and filling the interconnected condenser, liquid flow channel, evaporator and vapor flow channel for absorbing heat from the CPU in the evaporator to be evaporated, ascending through the vapor flow channel, entering into the condenser, radiating heat in the condenser to be liquefied, flowing down through the liquid flow channel, and returning to the evaporator.

2. The CPU cooling device in accordance with claim 1, wherein the flow area of the liquid flow channel is smaller than the flow area of the vapor flow channel.

* * * * *